(12) United States Patent
Ohtorii et al.

(10) Patent No.: US 7,033,943 B2
(45) Date of Patent: Apr. 25, 2006

(54) ETCHING SOLUTION, ETCHING METHOD AND METHOD FOR MANUFACTURING SEMICONDUCTOR DEVICE

(75) Inventors: Hiizu Ohtorii, Kanagawa (JP); Kaori Tai, Kanagawa (JP); Hiroshi Horikoshi, Kanagawa (JP); Naoki Komai, Kanagawa (JP); Shuzo Sato, Kanagawa (JP)

(73) Assignee: Sony Corporation, Tokyo (JP)

( * ) Notice: Subject to any disclaimer, the term of this patent is extended or adjusted under 35 U.S.C. 154(b) by 20 days.

(21) Appl. No.: 10/919,580

(22) Filed: Aug. 17, 2004

(65) Prior Publication Data

US 2005/0070110 A1    Mar. 31, 2005

(30) Foreign Application Priority Data

Oct. 30, 2002 (JP) ............................ P2002-315764
Aug. 21, 2003 (JP) ............................ 2003-297277

(51) Int. Cl.
*H01L 21/311* (2006.01)

(52) U.S. Cl. ...................................... 438/695; 438/622

(58) Field of Classification Search ................ 438/622, 438/653, 677, 687, 695, 709
See application file for complete search history.

(56) References Cited

U.S. PATENT DOCUMENTS 6,716,749 B1 *  4/2004  Noguchi et al. ............ 438/677

* cited by examiner

*Primary Examiner*—Phuc T. Dang
(74) *Attorney, Agent, or Firm*—Robert J. Depke; Trexler, Bushnell, Giangiorgi, Blackstone & Marr, Ltd.

(57) ABSTRACT

An etching solution includes an anticorrosive for copper or a benzotriazole based anticorrosive in a hydrofluoric acid aqueous solution. An etching method makes use of the etching solution set out above. Moreover, a method for manufacturing a semiconductor device which should include the step of removing copper by the etching method. The method includes the steps of forming copper through a barrier layer made of a metal or metal compound, which is greater in ionization tendency than copper, so as to bury a wiring groove formed in an insulating film with the copper, followed by polishing additional copper and barrier layer formed on the insulating film, and etching a surface layer of the insulating film by use of the etching solution to remove an insulating defective layer made mainly of the barrier layer on the insulating film along with the surface layer of the insulating film.

4 Claims, 11 Drawing Sheets

FIG. 2A
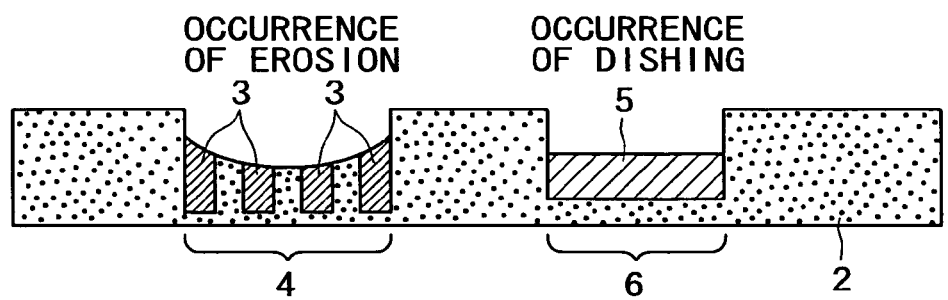
FIG. 2B ⇩
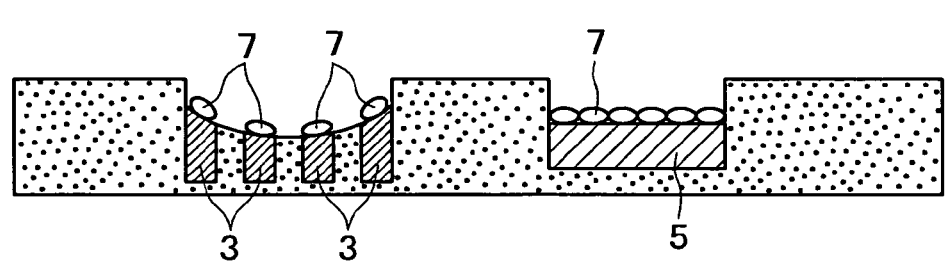
FIG. 2C ⇩
$4HF + SiO_2 \rightarrow SiF_4 + 2H_2O$
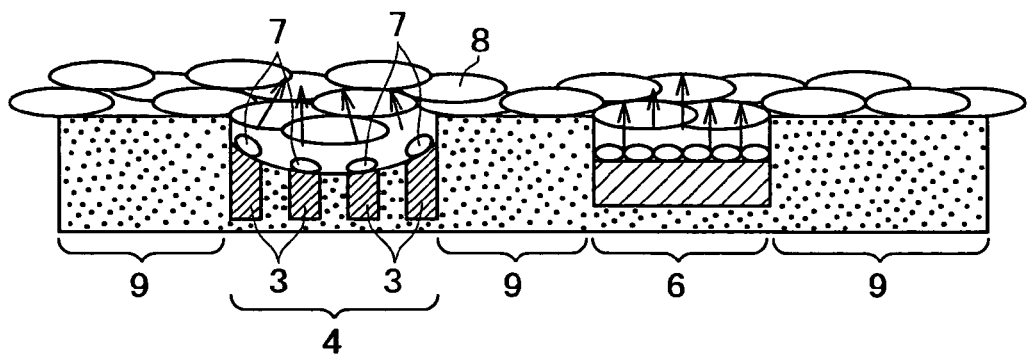
FIG. 2D ⇩
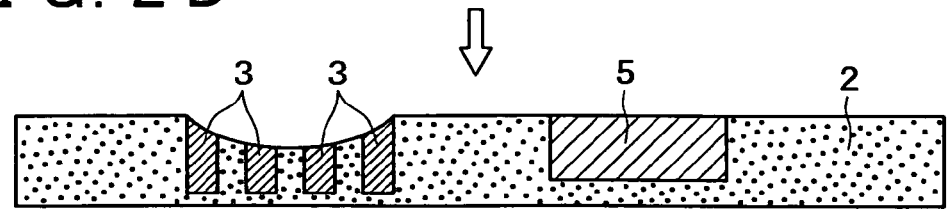

F I G. 3 A
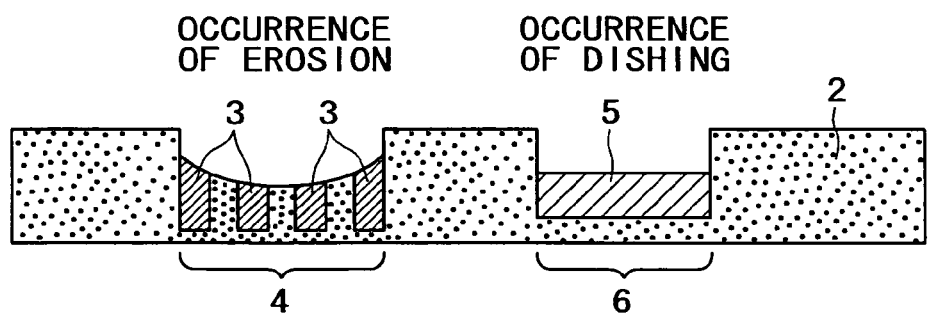
⇩
F I G. 3 B
$4HF + SiO_2 \rightarrow SiF_4 + 2H_2O$
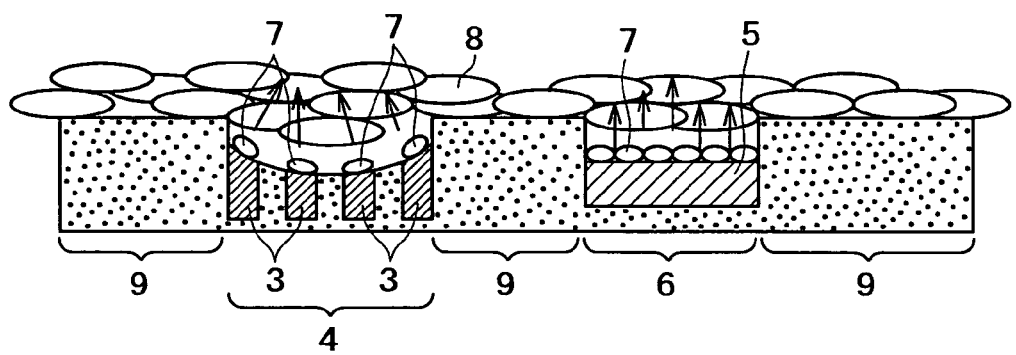
⇩
F I G. 3 C
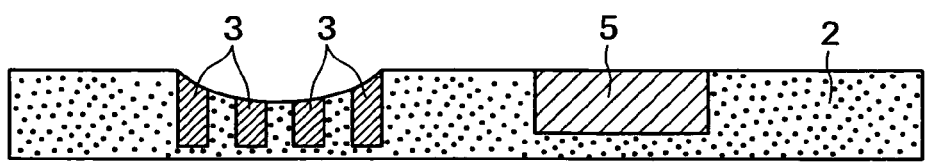

ETCHING TIME = 0 SECOND

ETCHING TIME = 60 SECONDS

ETCHING TIME = 120 SECONDS

ETCHING TIME = 180 SECONDS

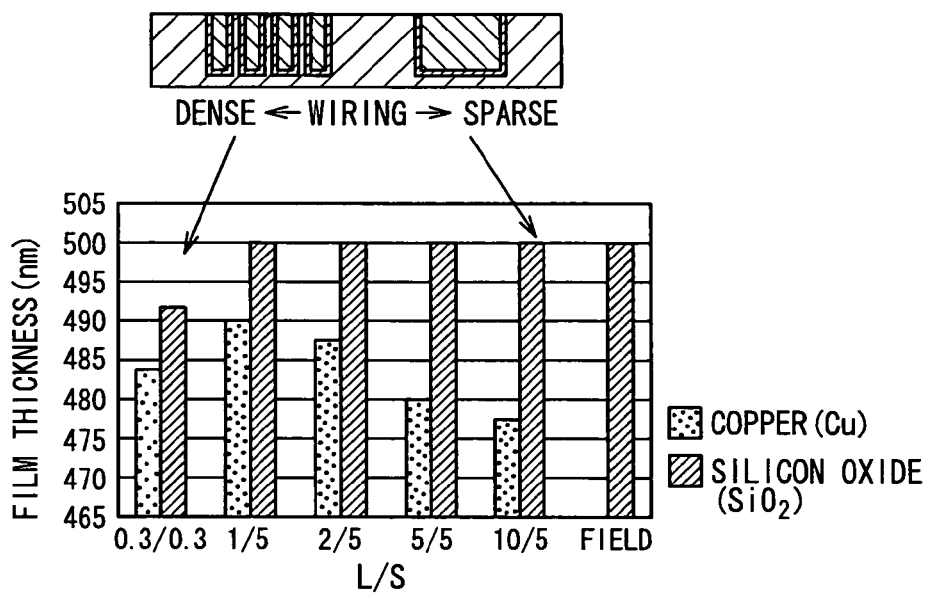
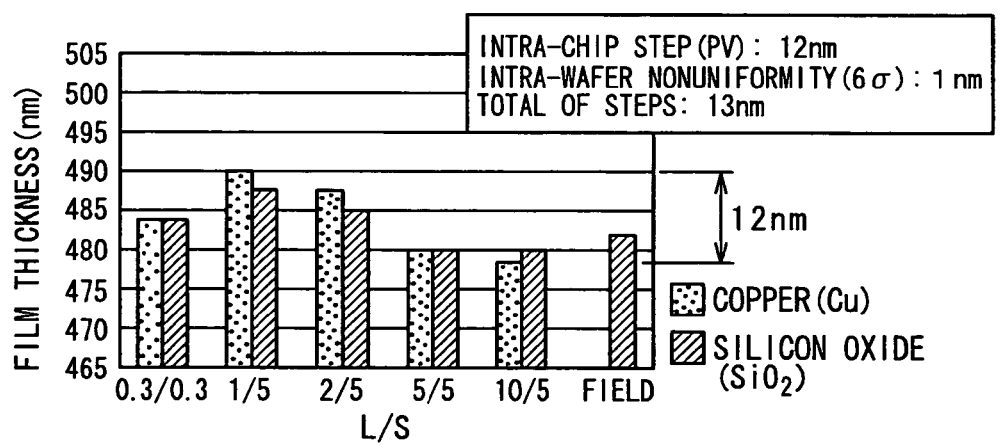

CMP CONDITION OF BARRIER LAYER
CMP DEPTH: 70nm

ETCHING SOLUTION, ETCHING METHOD AND METHOD FOR MANUFACTURING SEMICONDUCTOR DEVICE

The present application claims priority to Japanese Patent Application JP2003-297277, filed in the Japanese Patent Office August 21, 2003; the entire contents of which is incorporated herein by reference.

BACKGROUND OF THE INVENTION

This invention relates to an etching solution, an etching method and a method for manufacturing a semiconductor device. More particularly, the invention relates to an etching solution adapted for use in etching at the time of forming copper wiring, an etching method using the etching solution, and a method for manufacturing a semiconductor device using the etching method.

Copper wirings having a conventional groove wiring structure are formed in the following way. More particularly, as shown in FIG. 11A, copper 116 made of a copper seed layer 114 and a copper plated layer 115 is buried in a wiring groove 112 formed in an insulating film 111 via a barrier layer 113. Thereafter, additional copper 116 on the insulating film 111 is removed by chemical mechanical polishing (hereinafter referred to simply as CMP). In addition, an additional barrier layer 113 over the insulating film 111 is also removed by CMP making use of a polishing slurry for a barrier layer which is different from one used in the CMP for copper. As a consequence, a groove wiring 117 is formed of the copper 116 left within the wiring groove 112 through the barrier layer 113 as shown in FIG. 11B.

In this arrangement, however, as miniaturization of the wiring groove 112 proceeds, a difficulty is involved in forming, in good coverage, the barrier layer formed by a sputtering technique and made of tantalum, tantalum nitride or the like. To cope with this, attempts have been made to use, as a barrier layer, tungsten, tungsten nitride, titanium or titanium nitride that can be formed as a film according to a chemical vapor deposition technique (hereinafter referred to simply as CVD) ensuring good coverage. With the barrier layer 113 formed of a tungsten material such as tungsten, tungsten nitride or the like, or titanium that is likely to undergo film formation by CVD, so-called galvanic corrosion is caused wherein such a barrier layer 113 is corroded in the CMP step of removing additional copper (not shown) over the insulating film 111 (see, for example, "New materials/process technologies for Multi-layered Wirings for Next General ULSI", published by Kazuhiro Takausu (publisher) of Technical Information Institute Co., Ltd., and issued on Dec. 27, 2000 (first edition), pp. 249 to 252).

The galvanic corrosion occurs in such a way that when materials, such as tungsten, tungsten nitride, titanium and the like, whose potential relative to copper differs greatly (e.g. with a difference of about 1 V or over) and which have a potential poorer than copper is used, these materials are dissolved out in the polishing solution. Disappeared portions (fine interstices) 121 at the barrier layer 113, which result from the galvanic corrosion, can be suppressed to a degree of recess (or gap) of 10 nm or below by adjusting the pH of a slurry, forming a current barrier layer through oxidation of the copper, and minimizing the amount of an oxidizing agent for copper.

SUMMARY OF THE INVENTION

According to our experiments, it has been confirmed that where a material, such as tungsten, tungsten nitride, titanium or the like, which has a potential poorer than copper is used as a barrier layer, under which copper is polished by use of a copper polishing slurry containing a hydrogen peroxide solution, followed by further overpolishing to an extent of about 10%, the barrier layer is also polished. Nevertheless, a barrier layer is liable to be left on the insulating layer thinly (e.g. in a thickness of approximately 10 nm to 30 nm). This thinly left barrier layer serves as an insulation failure layer, thereby causing a leak current to be generated. Up to now, it is the usual practice for the removal of this insulation failure layer to mainly adopt a method wherein the capability of removing the insulating film (oxide film) in a slight degree is imparted to a polishing slurry for CMP of the barrier layer and the insulation failure layer is removed in the CMP step. This method requires CMP being carried out by two stages.

To avoid this, as shown in FIG. 12A, a barrier layer (hereinafter referred to as defective insulating layer) 131 left thinly on the insulating film 111 is etched with an aqueous hydrofluoric acid solution (e.g. a 0.5 vol % hydrofluoric acid aqueous solution), revealing that the defective insulating layer 131 left thinly on the insulating film 111 is removed along with the uppermost layer of the insulating film 111 and thus, no leak current is found. However, as shown in FIG. 12B, galvanic corrosion takes place in the barrier layer 113, and such a phenomenon that the copper 116 is corroded at the fine interstices 121 formed through the galvanic corrosion was found. This phenomenon is hereinafter referred to as interstitial corrosion. The interstitial corrosion of copper is considered to result from diluted hydrofluoric acid having a slight degree of dissociation and thus serving weakly as a kind of electrolytic solution between the copper 116 and the barrier layer 113.

Thus, one of the problems to be solved by the invention is to prevent interstitial corrosion of copper on etching of the barrier layer. Another problem is to prevent erosion in a region where the copper wiring is densely arranged, thereby permitting groove wirings of 0.1 μm and subsequent generations to be more miniaturized.

It is accordingly an object of the invention to provide an etching solution which does not cause galvanic corrosion of a barrier layer which is more liable to suffer the corrosion than copper and does not corrode copper in order to avoid the two-stage CMP procedure having a great process load.

It is another object of the invention to provide an etching method using such an etching solution as mentioned above and also a method for manufacturing a semiconductor device wherein groove wirings of copper are formed by use of the etching method, thereby miniaturizing groove wirings of the 0.1 μm and subsequent generations.

The etching solution of the invention has a most prominent feature in that it includes an anticorrosive for copper in a hydrofluoric acid aqueous solution.

The etching solution contains an anticorrosive for copper in a hydrofluoric acid aqueous solution. If, for example, copper and a metal or compound thereof that is greater in ionization tendency than copper are exposed to a hydrofluoric acid aqueous solution on the surface of a body to be etched, a protective film for preventing the copper surface from being corroded is formed by the action of the anticorrosive for copper, thereby inhibiting the copper from being corroded. Since the protective film is formed over the copper surface, so that if a metal or compound thereof having more susceptibility to corrosion than copper is exposed to a hydrofluoric acid aqueous solution having a kind of electrolytic solution although weak in electrolytic action, the galvanic corrosion of the metal, which is greater in ionization tendency than copper, or its compound can be prevented. In addition, the corrosion of copper is also prevented by means of the protective film. This permits the metal, which is greater in ionization tendency than copper, or compound thereof and copper not to undergo corrosion, and also permits etching of only a body to be etched with the hydrofluoric acid aqueous solution.

When at least one of a benzotriazole, a carboxylbenzotriazole, a methylbenzotriazole, a benzotriazole butyl ester, a silver benzotriazole and a chlorobenzotriazole is used as the anticorrosive, the copper surface is covered with the anticorrosive that is low in polarity and thus, the copper surface becomes hydrophobic. This suppresses the etching reaction of silicon oxide with hydrofluoric acid in a region where copper wirings susceptible to erosion is formed densely, thereby permitting the step caused by erosion to be reduced in depth (hereinafter referred to simply as eroded or erosion step).

The etching method according to the invention wherein copper and a metal or compound thereof which is greater in ionization tendency than copper are exposed to a surface of an insulating film and a surface layer of the insulating film in which the metal, which is greater in ionization tendency than copper, or compound thereof is left on the insulating film is etched, includes the steps of forming an anticorrosive for copper onto the copper surface to form a protective film, and removing the surface layer of the insulating film, in which the metal, which is greater in ionization tendency than copper, or compound thereof is left, with used of a hydrofluoric acid aqueous solution to eliminate the metal, which is greater in ionization tendency than copper, or compound thereof left on the insulating film.

The etching method of the invention is able to remove a metal or compound thereof which is greater in ionization tendency than copper and is left on the insulating film by etching the surface layer of the insulating film wherein the copper and the metal of greater ionization tendency or compound thereof is exposed to and the metal, which is greater in ionization tendency than copper, or compound thereof is left on the surface of the insulating film by use of a hydrofluoric acid aqueous solution containing an anticorrosive for copper.

According to this etching method, a protective film for preventing corrosion is formed on the copper surface by means of the anticorrosive for copper. The formation of the protective film permits the galvanic corrosion between the copper and the metal, which is greater in ionization tendency than copper, or metal compound to be prevented. The formation of the protective film also prevents the corrosion of copper. In this condition, when the surface layer of the insulating film etched, the metal, which is greater in ionization tendency than copper, or metal compound left on the surface layer is removed along with the etched surface layer of the insulating film. Where copper is buried through a barrier layer made, for example, of tungsten, a tungsten compound, titanium or a titanium compound in a groove formed in the insulating film and the barrier layer is thinly left on the insulating layer in an area where no groove is formed, the etching of the insulating film with a hydrofluoric acid aqueous solution containing an anticorrosive for copper enables the protective film to be formed on the copper surface by the action of the anticorrosive for copper. Thus, the protective film serves to prevent the copper from being corroded and also prevent the galvanic corrosion of the barrier layer formed inside the groove. The surface layer of the insulating film is etched in this condition, so that the barrier layer left on the insulating film is removed along with the removal of the surface layer of the insulating film.

When at least one of a benzotriazole, a carboxylbenzotriazole, a methylbenzotriazole, a benzotriazole butyl ester, a silver benzotriazole and a chlorobenzotriazole is used as the anticorrosive, the copper surface is covered with the anticorrosive that is low in polarity and thus, the copper surface becomes hydrophobic. This suppresses the etching reaction of silicon oxide with hydrofluoric acid in a region where copper wirings susceptible to erosion is formed densely, thereby permitting the step caused by erosion to be reduced in depth.

The method for manufacturing a semiconductor device according to the invention includes the steps of forming copper through a barrier layer made of a metal or metal compound, which is greater in ionization tendency than copper, so as to bury a wiring groove formed in an insulating film and subsequently polishing additional copper and barrier layer formed over the insulating film, and etching a surface layer of the insulating film by use of a hydrofluoric acid aqueous solution containing an anticorrosive for copper to remove the barrier layer left on the insulating film along with the surface layer of the insulating film.

In the manufacturing method of the semiconductor device, the surface layer of the insulating film is etched with the hydrofluoric acid aqueous solution containing an anticorrosive for copper, so that the barrier layer left on the insulating film is removed along with the etched surface layer of the insulating film. During the removal, a protective film capable of preventing the corrosion is formed on the copper surface within the wiring groove by means of the anticorrosive for copper. Thus, the corrosion of the copper is prevented, and the galvanic corrosion between the copper and the barrier layer is also prevented by the action of the protective film formed on the copper surface. This is why the barrier layer formed inside the wiring groove does not undergo galvanic corrosion. In this way, it becomes possible to convert the ordinary two-stage polishing procedure into a more inexpensive process of higher productivity including the steps of "polishing copper" and "slightly etching an insulating film (oxide film) with a hydrofluoric acid aqueous solution". It is to be noted that according to the experiment made by us, it has been found that the barrier layer can mostly be polished, for example, by overpolishing in the copper polishing step. This eventually leads to the fact that such a polishing step of the barrier layer alone that would be otherwise required becomes unnecessary.

Where at least one of a benzotriazole, a carboxylbenzotriazole, a methylbenzotriazole, a benzotriazole butyl ester, a silver benzotriazole and a chlorobenzotriazole is used as the anticorrosive, the copper surface is covered with the anticorrosive whose polarity is low, and the copper surface is rendered hydrophobic. Thus, as mentioned hereinbefore, the etching reaction of silicon oxide with hydrofluoric acid is suppressed in a region where copper wirings susceptible to erosion is formed densely, thereby permitting the step caused by erosion to be reduced in depth.

The etching solution of the invention contains an anticorrosive for copper in the hydrofluoric acid aqueous solution, with the following advantages: in case where copper and a metal, which is greater in ionization tendency than copper, or metal compound are exposed, for example, on the surface of a body to be etched with a hydrofluoric acid aqueous solution, the galvanic corrosion of the metal, which is greater in ionization tendency than copper, or metal compound can be prevented; the corrosion of copper can also be prevented by the action of the anticorrosive film; and thus, only a portion to be etched with the hydrofluoric acid aqueous solution can be selectively etched.

Using an etching solution to which an anticorrosive capable of preventing the corrosion of copper and rendering the copper surface hydrophobic is added, advantages are obtained in that no corrosion of copper takes place, and the barrier layer can be removed while suppressing the occurrence of erosion in a region where a wiring density is high.

The etching method according to the invention makes use of the etching solution of the invention. Thus, the effects of the etching solution can be obtained when carrying out the method. More particularly, the galvanic corrosion between copper and a metal, which is greater in ionization tendency than copper, or metal compound can be prevented, and the formation of an anticorrosive covering film on the copper surface permits the copper to be prevented from corrosion. In this condition, when the surface layer of the insulating film is etched, the metal which is greater in ionization tendency than copper or metal compound undesirably left on the insulating film can also be removed along with the etched surface layer of the insulating film. In this sense, tungsten, a tungsten compound, titanium or a titanium compound can be used as the metal which is greater in ionization tendency than copper or metal compound, for example. This is advantageous in that the metal or metal compound can be used as the barrier layer for the formation of a groove wring of copper.

In the etching method using an etching solution to which an anticorrosive capable of preventing the corrosion of copper and rendering the copper surface hydrophobic is added, advantages are obtained in that no corrosion of copper takes place, and the barrier layer can be removed while suppressing the occurrence of erosion in a region where a wiring density is high.

In the method for manufacturing a semiconductor device according to the invention, when the surface layer of the insulating film is etched with a hydrofluoric acid aqueous solution containing an anticorrosive for copper, the barrier layer left on the insulating film can be removed along with the etched surface layer of the insulating film without causing copper to be corroded. In this way, the ordinary process of carrying out the two-stage polishing procedure can be converted to a more inexpensive process of higher productivity including the steps of "copper polishing" and "slight etching of an insulating film (oxide film) with a hydrofluoric acid aqueous solution". As a consequence, it becomes sufficient to provide a copper polishing slurry alone as a polishing slurry, thus leading to a remarkable reduction of costs for consumable supplies, with the attendant advantage of the ease in control of the polishing step. In addition, the polishing step of barrier layer can be replaced by the etching (cleaning) step, so that erosion, dishing and the like can be appropriately avoided, with the advantage that the groove wiring characteristics can be improved. Moreover, the polishing step of the barrier layer is omitted, so that the physical load exerted on a wiring-forming layer can be reduced. Fragile insulating films of low dielectric constant such as, for example, a porous insulating film, a porous low dielectric constant film and the like can be easily introduced as the insulating film. This leads to the advantage that a method of manufacturing a semiconductor device wherein groove wirings of copper for the 0.1 μm and subsequent generations are formed is enabled.

With the manufacturing method using a polishing slurry to which an anticorrosive capable of preventing copper from being corroded in the course of polishing during a wiring step and rendering the copper surface hydrophobic is added, when tungsten, a tungsten compound, tantalum, a tantalum compound, titanium or a titanium compound is used as a barrier layer for the formation of a groove wiring of copper, the following advantages are obtained. The corrosion of copper can be suppressed when copper is polished (for example, by chemical mechanical polishing), and erosion is prevented from occurring in a region of high copper wiring density because of the hydrophobicity on the surface of the copper wiring. Especially, when tungsten, tungsten nitride, titanium or the like whose potential difference from copper is as great as 300 mV to 400 mV and is greater in ionization tendency than copper is used, the corrosion of copper can be advantageously suppressed upon polishing of copper (e.g. by chemical mechanical polishing). This enables one to adopt, as a barrier layer, a metal film or metal compound film that can be formed according to a CVD method or an ALD method ensuring excellent coverage on use as a barrier metal for copper wiring of a groove wiring structure. Thus, an advantage is obtained in that the method is responsible for the miniaturization of groove wirings of copper for the 0.1 μm and subsequent generations.

BRIEF DESCRIPTION OF THE DRAWINGS

FIGS. 2A to 2D are, respectively, a schematic view illustrating an etching action in a first etching method of the invention;

FIGS. 3A to 3C are, respectively, a schematic view illustrating an etching action in a second etching method of the invention;

FIGS. 9A and 9B are, respectively, a graphical representation illustrating a reduction of global step attained by the formation of a groove wiring using an etching method of the invention;

DETAILED DESCRIPTION OF THE PREFERRED EMBODIMENTS

Figure 1A:
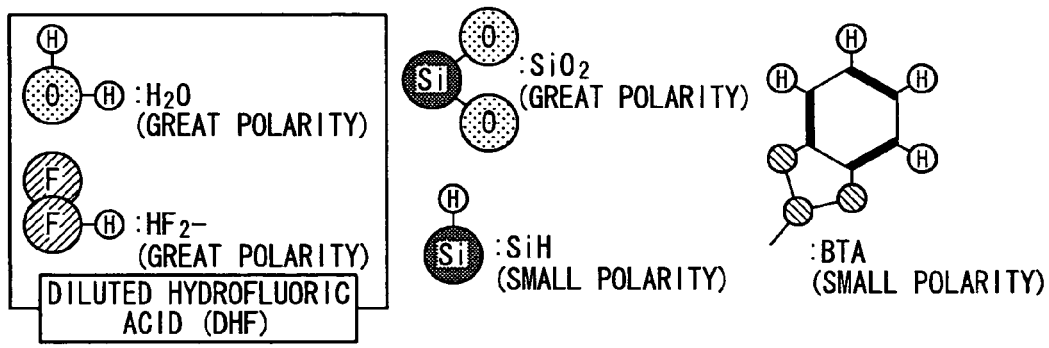
FIGS. 1A to 1D are, respectively, a schematic view illustrating how an etching solution works.

In chemical mechanical polishing of copper for forming a copper wiring of a groove wiring structure, the purpose of preventing the corrosion of cooper and also preventing the occurrence of erosion in a region where a wiring density is high could be realized by adding, as an anticorrosive for copper, a benzotriazole (BTA) based anticorrosive to an etching solution. The barrier layer was removed for the formation of the copper wiring by use of such an etching solution, the formation of copper wirings of a semiconductor device could be realized without causing the corrosion of copper and suppressing the occurrence of erosion.

Examples of the invention relating to etching solutions, an etching method and a method for manufacturing a semiconductor device are described below.

EXAMPLE 1

The etching solution of the invention is one which contains an anticorrosive for copper in a hydrofluoric acid aqueous solution. The hydrofluoric acid aqueous solution is, for example, a hydrofluoric acid aqueous solution containing 0.1% to 10%, preferably 0.1% to 2.0%, in which at least an anticorrosive for copper should be contained. The anticorrosive for copper is favorably contained in an amount, for example, of about 500 ppm.

The anticorrosive should preferably have a molecule size of not larger than 10 nm, for which at least one of a benzotriazole, a carboxylbenzotriazole, a methylbenzotriazole, a benzotriazole butyl ester, a silver benzotriazole and a chlorobenzotriazole can be used. As a matter of course, the anticorrosives may be used in combination. The size of the molecules is approximately at 1 nm. Since an anticorrosive for copper whose size of molecule is not larger than 10 nm is used, the copper surface can be protected such that if a narrow interstice (with a width of the interstice being usually on the order of ten and several nm) is caused in the barrier layer through galvanic corrosion, the anticorrosive for copper infiltrates into the interstice. In this sense, it is preferred to select an anticorrosive for copper whose size of molecule is as small as possible.

For a benzotriazole (hereinafter abbreviated as BTA), mention is made, for example, of 1H-BTA of the following Chemical Formula 1:

[Chemical Formula 1]

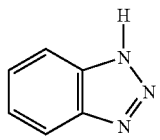

As a carboxylbenzotriazole, 4-carboxyl-1,H-BTA of the Chemical Formula 2 may be mentioned, for example,

[Chemical Formula 2]

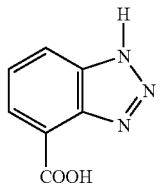

For a methylbenzotriazole mention is made, for example, of 4-methyl-1,H-BTA (tolyltriazole: TTA) of the following Chemical Formula 3 and 5-methyl-1,H-BTA (tolyltriazole: TTA) of the following Chemical Formula 4:

[Chemical Formula 3]

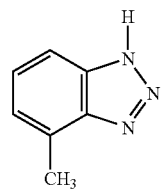

[Chemical Formula 4]

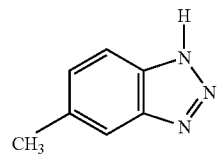

For a benzotriazole butyl ester (BTA butyl ester), mention is made, for example, of a compound of the following Chemical Formula 5:

[Chemical Formula 5]

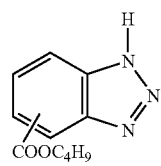

For a silver benzotriazole (silver BTA), mention is made, for example, of a compound of the following Chemical Formula 6:

[Chemical Formula 6]

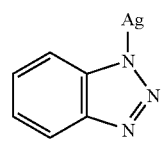

For a chlorobenzotriazole, mention is also made, for example, of 5-chloro-1,H-BTA of the following Chemical Formula 7 and 1-chloro BTA of the following Chemical Formula 8:

[Chemical Formula 7]

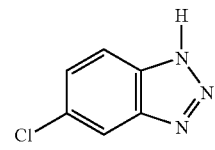

[Chemical Formula 8]

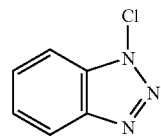

Besides, sodium tolyltriazole of the following Chemical Formula 9 may also be used as an anticorrosive for copper:

[Chemical Formula 9]

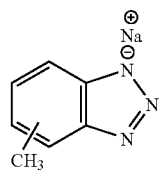

The etching solution contains an anticorrosive for copper in a hydrofluoric acid aqueous solution, so that if copper and a metal or metal compound, which is greater in ionization tendency than copper, are exposed on a surface of a body to be etched with the hydrofluoric acid aqueous solution, for example, a protective film having an anticorrosive effect is formed on the copper surface by means of the anticorrosive for copper, thereby preventing the copper from being corroded. The formation of the protective film on the copper surface permits the metal which is greater in ionization tendency than copper or metal compound to be prevented from undergoing galvanic corrosion if the copper and the metal, which is greater in ionization tendency than copper, or metal compound are exposed to a hydrofluoric acid aqueous solution having the function as an electrolytic solution although weak in nature. This ensures etching of a portion to be etched with a hydrofluoric acid aqueous solution without involving corrosion of the metal, which is greater in ionization tendency than copper, or metal compound and copper.

The benzotriazole based anticorrosives such as a benzotriazole, a carboxylbenzotriazole, a methylbenzotriazole, a benzotriazole butyl ester, a silver benzotriazole, a chlorobenzotriazole and the like have the function of rendering a copper surface hydrophobic. This is because a film of a benzotriazole based anticorrosive whose molecule is low in polarizability is formed on the copper surface.

This is described in more detail with reference to FIGS. 1A to 1D. In the figures, the case where benzotriazole (BTA) is used as an anticorrosive is shown although similar results are obtained when using any of the benzotriazole based anticorrosives shown in the forgoing Chemical Formulas 1 to 9. As shown in FIG. 1A, $H_2O$ and $HF_2-$ in diluted hydrofluoric acid (DHF) are both high in polarity. Silicon oxide ($SiO_2$) constituting the insulating film in which a copper wiring is formed has large polarity, and silicon terminated with hydrogen (SiH) is small in polarity. Benzotriazole (BTA) is terminated with hydrogen and has such a nature of small polarity.

Figure 1B:
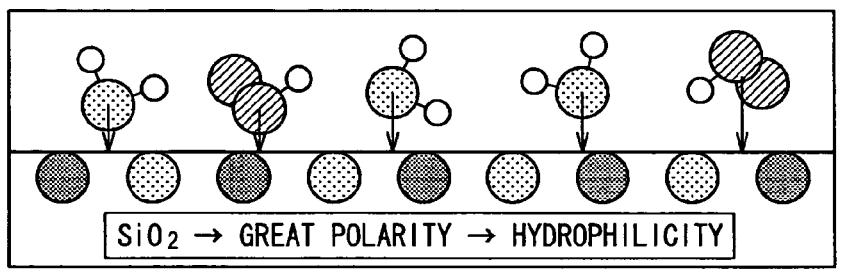

In view of the field region where silicon oxide is formed, as shown in FIG. 1B, the surface of the field region is made of $SiO_2$ having large polarity. Diluted hydrofluoric acid (DHF) which acts on the region is formed of $H_2O$ and $HF_2-$, both having high polarity. Accordingly, the surface of the field region becomes large in polarity.

Figure 1C:
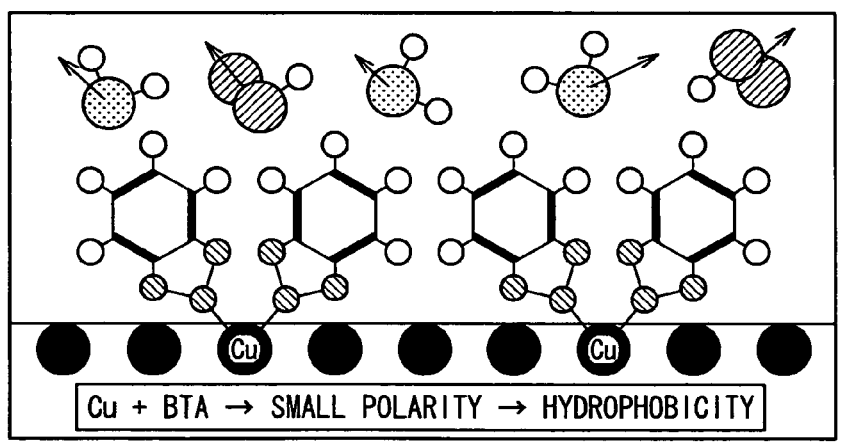
Figure 1D:
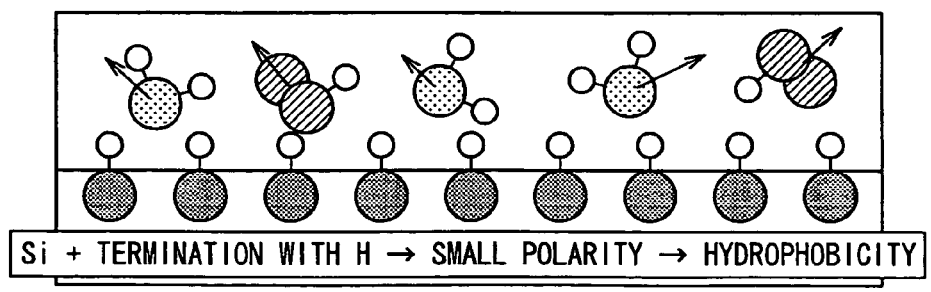

On the other hand, at a copper wiring densified portion where copper wirings are densely formed, benzotriazole (BTA) having small polarity acts on to cover the copper surface therewith as is particularly shown in FIG. 1C. The BTA is terminated with hydrogen and is not influenced by $H_2O$ and $HF_2-$, both having high polarity. Thus, the copper surface covered with BTA is rendered hydrophobic, like the silicon (Si) surface terminated with hydrogen (H) as shown in FIG. 1D.

The etching solution having such a function as set out above can be used during the formation of a copper wiring of a groove wiring structure in the case where excess copper and barrier metal on the insulating film made of silicon oxide are removed by polishing, followed by removal of a remaining barrier metal by etching. With this type of etching solution, at the field region made of silicon oxide, the etching thereof proceeds by the action of the diluted hydrofluoric acid, and at the copper wiring densified portion, etching of the silicon oxide is suppressed. Thus, it is expected to suppress the erosion caused in a region where copper wirings are densely formed.

EXAMPLE 2

Next, the etching methods of the invention are described below.

A first etching method of the invention is one which includes etching a surface layer of an insulating film having copper and a metal or metal compound, which is greater in ionization tendency than copper, exposed on the surface thereof and also having the metal, which is greater in ionization tendency than copper, or metal compound left thereof. Initially, an anticorrosive for copper is applied onto the copper surface to form a protective film. For the anticorrosive for copper, at least one of a benzotriazole, a carboxylbenzotriazole, a methylbenzotriazole, a benzotriazole butyl ester, a silver benzotriazole, and a chlorobenzotriazole can be used. Next, a hydrofluoric acid aqueous solution is used to remove the surface layer of the insulating film in which the metal, which is greater in ionization tendency than copper, or metal compound is left. In this way, the metal, which is greater in ionization tendency than copper, or metal compound left on the insulating film can be removed according to this method.

In the first etching method, a relatively strong protective film for copper is formed, prior to etching treatment using a hydrofluoric acid aqueous solution, by use of an anticorrosive for copper. This suppresses the corrosion current between the copper and the hydrofluoric acid aqueous solution from passing therethrough, thus enabling one to suppress the interstitial corrosion of copper after removal of a barrier layer for the formation of copper wiring. The molecule of an anticorrosive for copper should preferably be small in size and is preferably 10 nm or below. Such small molecules ensure the dense formation of the copper protective film from the anticorrosive for copper. This enhanced the covering effect of copper along with anticorrosive effect. If the barrier layer undergoes corrosion through galvanic corrosion, the anticorrosive for copper is likely to enter the resulting interstice caused by the corrosion, thereby preventing the corrosion of copper.

The benzotriazole based anticorrosives made of a benzotriazole, a carboxylbenzotriazole, a methylbenzotriazole, a benzotriazole butyl ester, a silver benzotriazole, and a chlorobenzotriazole function to render the copper surface hydrophobic. This is because of the formation, on the copper surface, of a benzotriazole (BTA) based anticorrosive which is made of molecules of low polarizability. The function of the BTA based anticorrosive is similar to that described with reference to FIGS. 1A to 1D.

Where a copper wiring having a groove wiring structure is formed, the etching solution having such a function as set forth above can be used for removal of a barrier metal left on the insulating film by etching after removal, by polishing, of additional copper and barrier metal left on the insulating film made of silicon oxide.

As shown in FIG. 2A, an insulating film 2 after polishing undergoes erosion at a copper wiring densified portion 4 where copper wirings 3 are densely formed, and dishing occurs at a region 6 where a copper wiring 5 is wide in area.

In this condition, as shown in FIG. 2B, a benzotriazole (BTA) based anticorrosive is applied to, thereby covering the copper wirings 3, 5 with the BTA based anticorrosive 7.

As shown in FIG. 2C, field portions 9 made of silicon oxide are etched with diluted hydrofluoric acid 8. More particularly, the diluted hydrofluoric acid acts on the field portions 9 to cause etching to proceed. At the copper wiring densified portion 4, the copper wirings 3 are covered on the surface thereof with the BTA based anticorrosive 7 and are rendered hydrophobic, so that etching of the silicon oxide is suppressed. Thus, the silicon oxide at the copper wiring densified portion 4 (i.e. a region where erosion occurs) where the copper wirings 3 are densely formed is suppressed from being etched, and the etching at the field portion 9 is facilitated according to the reaction of $4HF+SiO_2 \rightarrow SiF_4+2H_2O$.

This results in a state where erosion is suppressed from further progress. Thus, as shown in FIG. 2D, the insulating film 2 wherein the copper wirings 3, 5 have been formed becomes globally flattened.

EXAMPLE 3

A second etching method of the invention is one wherein using such a hydrofluoric acid aqueous solution containing an anticorrosive for copper as set out hereinbefore, the surface layer of the insulating film on which copper and the metal, which is greater in ionization tendency than copper, or metal compound are both exposed and the metal, which is greater in ionization tendency than copper, or metal compound is left is etched to remove the metal, which is greater in ionization tendency than copper, or metal compound left on the insulating film.

The etching solution used in the second etching method is prepared in the following way.

In a first preparation method, an etching solution is obtained by adding, to a hydrofluoric acid aqueous solution (having a concentration of 0.1 vol % to 10 vol %, preferably 0.1 vol % to 2.0 vol %), 10 ppm to 500 ppm of such an anticorrosive for copper as illustrated hereinbefore and is used for etching.

In a second preparation method, a mixing solution is obtained such that immediately before feeding an etching solution to the surface of the insulating film, 10 ppm to 500 ppm of such an anticorrosive for copper as set out hereinbefore is mixed with a hydrofluoric acid aqueous solution (having a concentration of 0.1 vol % to vol %, preferably 0.1 vol % to 2.0 vol %). This mixed solution is used as an etching solution for the etching method.

In either of these preparation methods, the anticorrosive for copper should preferably be made of molecules whose size is 10 nm or below. The molecule size of 10 nm or below is advantageous in that if galvanic corrosion occurs in the barrier layer when a copper wiring of a groove wiring is formed, the anticorrosive for copper is able to infiltrate into the resulting interstice, thereby preventing the interstitial corrosion of copper.

In the second etching method, a relatively strong protective film is formed on the copper surface by means of an anticorrosive for copper containing in the hydrofluoric acid aqueous solution. This film acts to suppress the corrosion current between the copper and the hydrofluoric acid aqueous solution from passing therethrough. Thereby, the interstitial corrosion of copper is prevented after the removal of the barrier layer when a copper wiring of a groove wiring is formed. In comparison with the first etching method, the second etching method is advantageous in that if the protective film is lost by the etching action with the hydrofluoric acid aqueous solution during the etching treatment, the anticorrosive for copper is invariably supplied to the copper surface, the copper surface is covered with the protective film of the anticorrosive for copper.

The anticorrosive for copper is added to the hydrofluoric acid aqueous solution, so that a dense protective film of the anticorrosive is formed on the surface layer of copper wiring and thus, corrosion current that serves as a trigger for the interstitial corrosion of copper can be suppressed.

It will be noted that where there is the possibility that adverse influences of compositional separation, settlement of anticorrosive, oxidation and the like depending on the mixing ratio between the hydrofluoric acid aqueous solution and the anticorrosive, it is preferred to adopt the second method. A mixing ratio of an anticorrosive for copper to the hydrofluoric acid aqueous solution is, for example, about 500 ppm of an anticorrosive for copper relative to a 0.5 vol % hydrofluoric acid aqueous solution.

The benzotriazole based anticorrosives such as a benzotriazole, a carboxylbenzotriazole, a methylbenzotriazole, a benzotriazole butyl ester, a silver benzotriazole, and a chlorobenzotriazole have the function of rendering a copper surface hydrophobic. This is because a film of a benzotriazole (BTA) based anticorrosive which is a molecule of low polarity is formed on the copper surface. The function of the BTA based anticorrosive is similar to that illustrated with reference to FIGS. 1A to 1D.

Accordingly, the etching solution having such a function as set out above can be applied to the formation of a copper wiring of a groove wiring structure wherein after removal of additional copper and barrier metal on an insulating film made of silicon oxide by polishing, the barrier metal left on the insulating film is removed by etching.

As shown in FIG. 3A, the insulating film 2 after polishing undergoes erosion at the copper wiring densified portion 4 where the copper wirings are densely formed and dishing at the region 6 having a wide area of the copper wiring 6.

To avoid this, as shown in FIG. 3B, when silicon oxide is etched with the etching solution, a benzotriazole (BTA) based anticorrosive is acted thereon so that the copper wirings 3, 5 are covered with the BTA based anticorrosive 7 and the silicon oxide portion is etched with the diluted hydrofluoric acid 8. More particularly, etching proceeds by the action of diluted hydrofluoric acid at the field portion 9 made of silicon oxide and etching of silicon oxide is suppressed at the copper wiring densified portion 4. For this reason, etching of the copper wiring densified portion 4 (i.e. a region where erosion occurs) is suppressed in the above polishing step, and etching of the field portion 9 is promoted through the reaction of $4HF+SiO_2 \rightarrow SiF_4+2H_2O$.

As a result, progress of erosion is suppressed, under which as shown in FIG. 3C, global planarization of the insulating film 2 where the copper wirings 3, 5 have been formed is enabled.

EXAMPLE 4

An example relating to a method of manufacturing a semiconductor device according to the invention is illustrated with reference to FIGS. 4A to 4D.

Figure 4A:
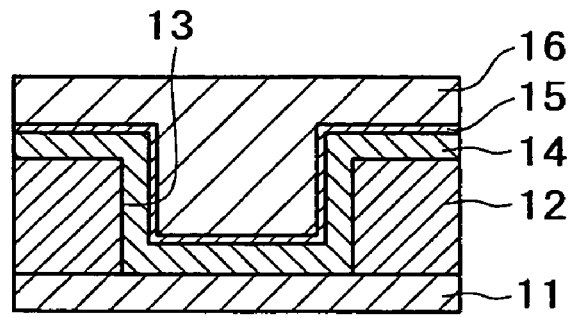
FIGS. 4A to 4D are, respectively, a sectional view showing a manufacturing process of an example of a method of manufacturing a semiconductor device according to the invention.

As shown in FIG. 4A, a first insulating film 11, e.g. a silicon nitride film, is formed on a substrate (not shown), and a second insulating film 12, e.g. a silicon oxide film, is formed on the first insulating film 11. According to ordinary lithographic and etching techniques, a wiring groove 13 is formed in the second insulating film 12. At this stage, the first insulating film 11 serves as an etching stopper. Next, a barrier layer 14 is formed on the inner surface of the wiring groove 13 and the surface of the second insulating film 12 according to a chemical vapor deposition technique. For the barrier layer 14, a single film or a built-up film made of tungsten, a tungsten compound (e.g. tungsten nitride (WN)), tantalum, a tantalum compound (e.g. tantalum nitride (TaN)), titanium and/or a titanium compound (e.g. titanium nitride (TiN)). The barrier layer may be formed by a film-forming method such as a chemical vapor deposition (CVD) method, an ALD (atomic layer deposition) method or the like. Subsequently, a copper seed layer 15 is formed. Next, copper 16 is deposited so as to bury the wiring groove 13 according to a plating method. During the deposition, copper 16 is additionally deposited on the second insulating film 12.

Figure 4B:
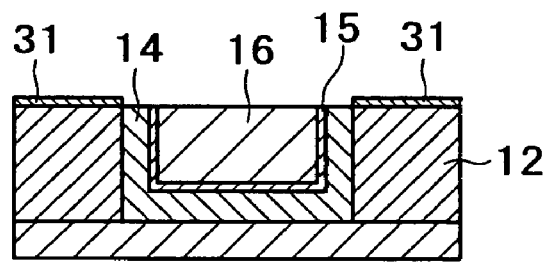

Next, as shown in FIG. 4B, by CMP, the additional copper 16 (including the copper seed layer 15) on the second insulating film 12 and the barrier layer 14 are removed by polishing with a polishing slurry for copper. More particularly, overpolishing is carried out as an extension for the polishing of copper to remove the barrier layer 14. However, this polishing allows the barrier layer 14 to be thinly left on the second insulating film 12, thereby providing a defective insulating film 31. It will be noted that for the above-described polishing, it is preferred to use a polishing slurry to which such an anticorrosive for copper as set out hereinbefore.

Figure 4C:
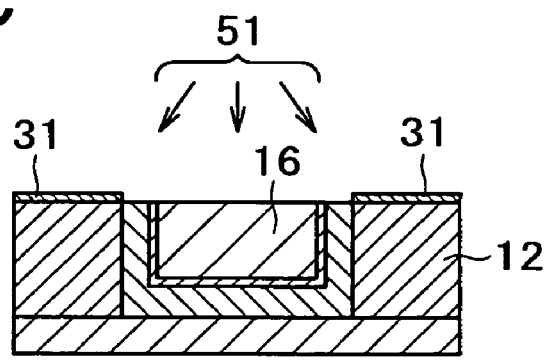

Next, as shown in FIG. 4C, an etching solution 51 of the invention, which is made of a hydrofluoric acid aqueous solution containing such an anticorrosive for copper as set out hereinbefore, is applied onto the second insulating film 12 at which the copper 16 is exposed to etch the surface layer of the second insulating film 12. In the course of the etching, a protective film (not shown) is formed on the copper surface by the action of an anticorrosive for copper, and the surface layer (e.g. a portion of the surface layer in a thickness of 1 nm to 50 nm, preferably 1 nm to 20 nm) of the second insulating film 12 is etched and removed. Besides, an insulating defective film 31 left on the second insulating film 12 is removed in a so-called liftoff state. When set at the above-indicated thickness for removal, the defective insulating film 31 (see FIG. 4B) can be reliably removed. The thickness for removal is at 50 nm in maximum, preferably at 20 nm or less, so that a significant step that would otherwise influence subsequent steps is not formed through the removal.

Figure 4D:
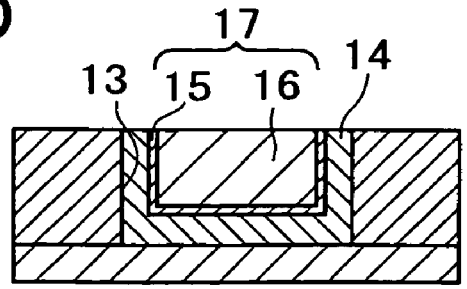

As a consequence, as shown in FIG. 4D, interstitial corrosion of copper does not occur in the removal step of the copper 16 and the barrier layer 14. A copper wiring 17 wherein the copper 16 (including the copper seed layer 15) is buried in the wiring groove 13 is formed only through one CMP step and one etching step.

Next, an example of etching using a hydrofluoric acid aqueous solution containing an anticorrosive for copper is described below. Etching was carried out using an etching solution wherein 300 ppm of BTA carboxylic acid was added to a 0.5% hydrofluoric acid aqueous solution. The etching test was conducted using an etching time set at 120 seconds, tungsten as a barrier layer, and a copper groove wiring with a line and space of 0.23 μm. The surface condition of after the etching was observed through an electron microscope. As a result, it was confirmed that no interstitial corrosion of copper occurred. As will be apparent from the result, evidence was given that the interstitial corrosion of copper resulting from the galvanic corrosion involved by use of the etching solution of the invention is suppressed and thus, copper wiring of good reliability can be formed.

Next, the relation between the galvanic current density and the mixing ratio of the anticorrosive for copper is illustrated with reference to FIG. 5.

Figure 5:
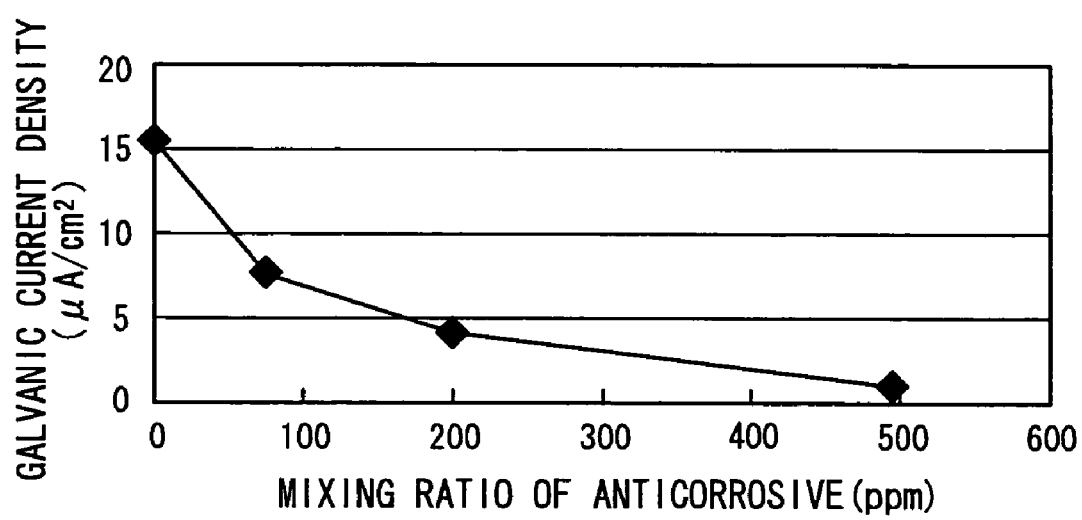
FIG. 5 is a graphical representation showing the relation between the galvanic current density and the mixing ratio of an anticorrosive for copper.

As shown in FIG. 5, it was found that as the mixing ratio of the anticorrosive for copper increases, the galvanic current density lowers. It was also found that when the mixing ratio of the anticorrosive for copper is at 500 ppm, the galvanic current density lowers substantially to a satisfactory extent. It will be noted that when the anticorrosive for copper was added in an amount exceeding 500 ppm, the galvanic current density was substantially at a level corresponding to that attained by 500 ppm. These tendencies were similar in both the first and second methods. Accordingly, the mixing ratio of an anticorrosive for copper should be 10 ppm to 500 ppm, preferably 50 ppm to 200 ppm.

In the method of manufacturing a semiconductor device, the surface layer of the second insulating film 12 is etched with a hydrofluoric acid aqueous solution containing an anticorrosive for copper, whereupon the defective insulating film 31 wherein the barrier layer 14 is thinly left on the second insulating film 12 is removed along with the etched surface layer of the second insulating film 12. At the same time, a protective film for preventing corrosion is formed by means of an anticorrosive for copper on the surface of the copper 16 inside the wiring groove 13, so that the corrosion of the copper 16 is prevented. Accordingly, the corrosion between the copper 16 and the barrier layer 14 is prevented. Thus, the barrier layer 14 formed inside the wiring groove 13 undergoes no galvanic corrosion. In this way, the process conversion of from a process involving the ordinarily employed two-stage polishing step ordinarily employed up to now to an inexpensive process of high productivity including "polishing step of copper" and "slight etching step of insulating film (oxide film) with a hydrofluoric acid aqueous solution" become possible. It is to be noted that according to our experiment, substantially all the barrier layer 14 could be polished off when overpolishing is, for example, carried out in the polishing step of copper 16. Eventually, this does not need the step of polishing the barrier layer 14 alone that has been hitherto accepted as necessary.

Where at least one of a benzotriazole, a carboxylbenzotriazole, a methylbenzotriazole, a benzotriazole butyl ester, a silver benzotriazole, and a chlorobenzotriazole is used as the anticorrosive, the surface of the copper 16 is covered with the anticorrosive of low polarizability, thus rendering the copper 16 surface hydrophobic. The function of the BTA based anticorrosive is similar to that illustrated with reference to FIGS. 1A to 1D.

Accordingly, as illustrated with respect to the second etching method, diluted hydrofluoric acid acts on the field region made of silicon oxide wherein etching proceeds. With a region where copper wirings are densely formed, etching of silicon oxide is suppressed. Hence, etching is suppressed, in the polishing step, in a region where erosion occurs in the region of copper wirings being densely formed, whereas etching in the field region is promoted, resulting in the state of suppressing erosion from proceeding. Thus, global planarization of the second insulating film forming the copper wiring therein is enabled.

Next, the relation between the step caused by erosion and the etching time is described with reference to FIGS. 6A to 6D. The ordinate in these figures indicates a step and the abscissa indicates a distance along the scanning direction at the time of measurement of the step. Each scale or division along the ordinate indicates 4 nm and each scale along the abscissa indicates 50 μm.

Figure 6A:
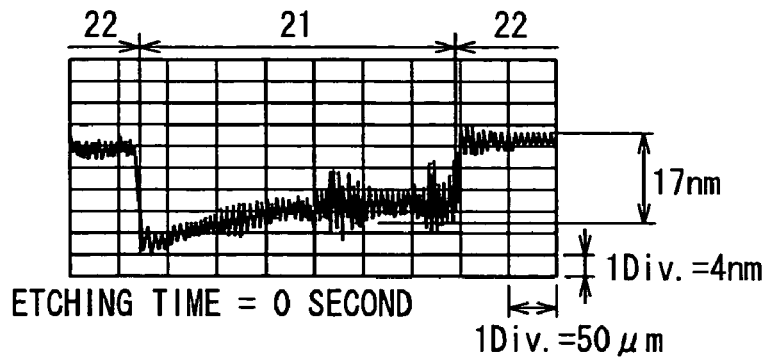
FIGS. 6A to 6D are, respectively, an illustrative view showing the relation between the erosion step and the etching time in a method of manufacturing a semiconductor device according to the invention.

FIG. 6A shows the results of measurement of a surface stepped state after removal of additional copper from the second insulating film. As shown, the wiring densified portion 21 having a high wiring density is stepped, due to erosion, relative to the surface of the field portion 22 of the second insulating film. The step was found to be at about 17 nm.

Figure 6B:
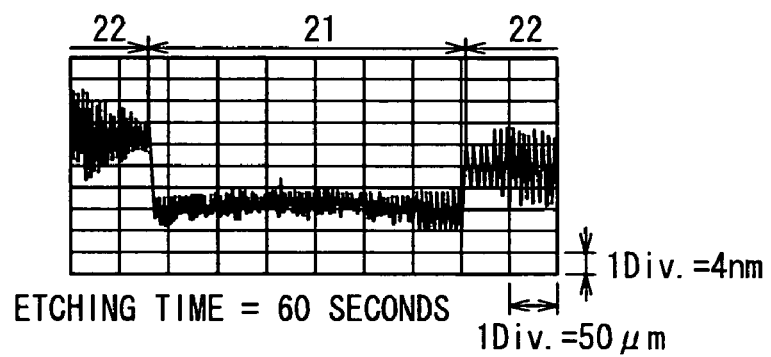

In this condition, etching was carried out using an etching solution of the invention. The stepped state of the surface is shown in FIG. 6B. As shown in FIG. 6B, the step ascribed to erosion tends to be reduced.

Figure 6C:
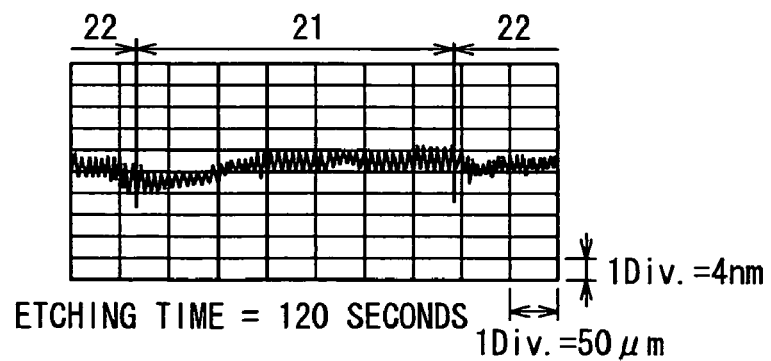
Figure 7:
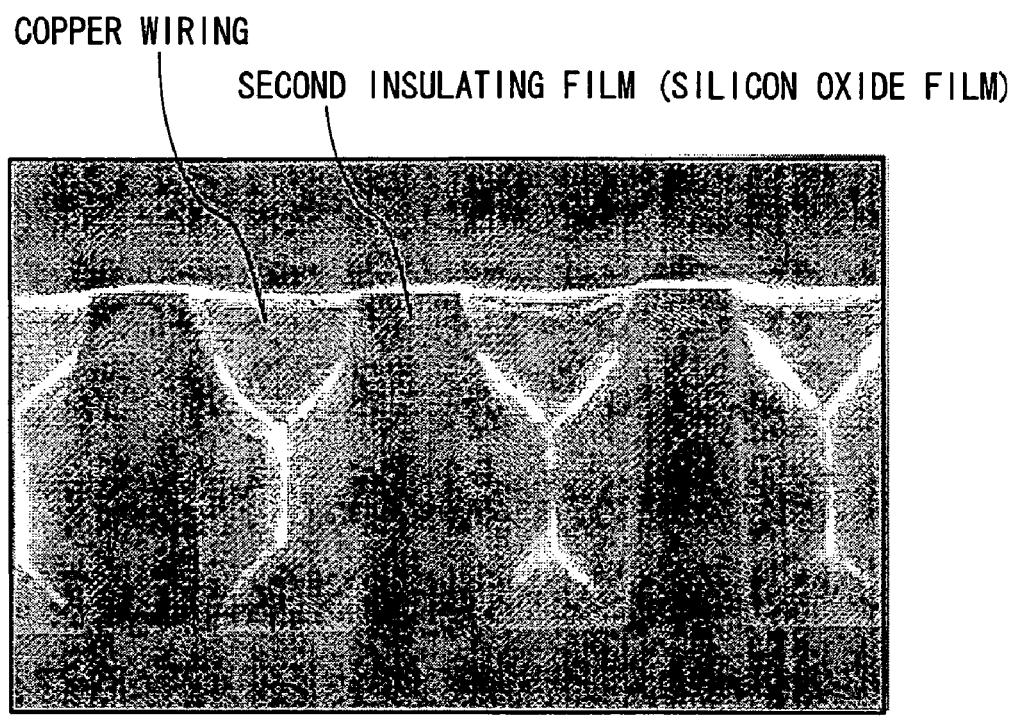
FIG. 7 is a photograph showing a dense area, in section, of wirings when the etching time is at 120 seconds.

The etching was further continued, with the stepped state of the surface at an etching time of 120 seconds being shown in FIG. 6C. As shown in FIG. 6C, the step problem caused by erosion is substantially solved, and no substantial step between the wiring densified portion 21 and the field portion 22 of the second insulating film is observed. The photograph of a section at the wiring densified portion 21 of the above-mentioned state is shown in FIG. 7. As shown in FIG. 7, little step between the wirings at the wiring densified portion 21 and the second insulating film made of silicon oxide is seen, revealing that a smooth plane is formed.

Figure 6D:
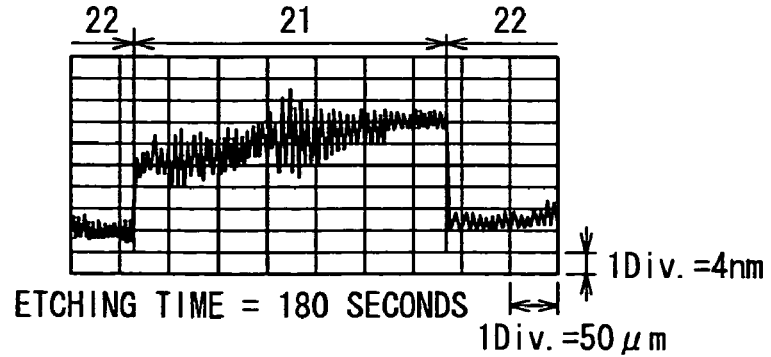

When etching is further carried out, only the field portion 22 of the second insulating film is overetched and the wiring densified portion 21 is observed as convexly protruded relative to the filed portion 22 as shown in FIG. 6D. This is considered for the reason that while the wiring densified portion 21 is rendered hydrophobic by application of a benzotriazole based anticorrosive thereon, diluted hydrofluoric acid is unlikely to act on the silicon oxide of the wiring densified portion 21. Thus, it has been found that the use of the etching solution of the invention for the formation of copper wiring is very effective in overcoming the problem of erosion caused during the polishing for removal of additional copper and barrier layer.

Figure 8:
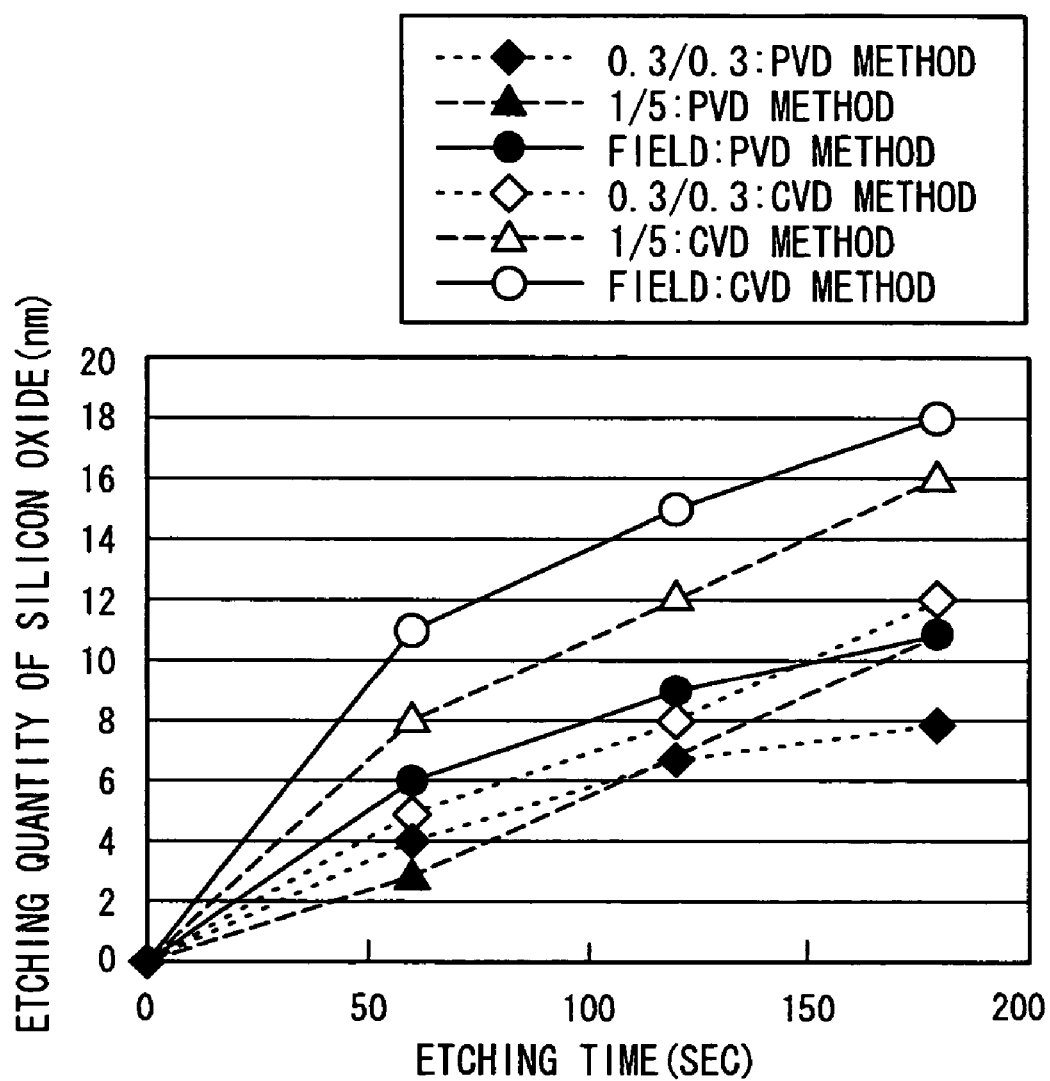
FIG. 8 is a graphical representation showing the relation between the etching depth of silicon oxide and the etching time for different manners of etching and different lines and spaces in a method of manufacturing a semiconductor device according to the invention.

Next, with respect to the difference in etching action between the barrier layer formed by a PVD method and the barrier layer formed by a CVD or ALD method, the relation between the etching quantity or depth and the etching time is illustrated with reference to FIG. 8 for different line and space values and different film-forming methods. In FIG. 8, the ordinate indicates an etching quantity or depth and the abscissa indicates an etching time.

As shown in FIG. 8, for the same etching time, the etching quantity of the silicon oxide film formed as a barrier layer according to the PVD method is smaller than the etching quantity of the silicon oxide film formed as a barrier layer according to the CVD method with respect to any of 0.3 μm in line and 0.3 μm in space (0.3/0.3), 1 μm in line and 5 μm in space (1/5) and the field. This is because when the barrier layer is formed by the PVD method, the component of the barrier layer diffuses into the silicon oxide film and retards the etching rate of silicon oxide. When the barrier layer is formed by the PVD method, etching selectivity becomes instable, resulting in an increasing quantity of diffusion of the barrier layer component. If the diffusion layer is formed as thick, full removal with the etching solution is not possible. As will be seen from the above, with the removal of the barrier layer by use of an etching solution of the invention, the barrier layer formed by the PVD method may not be fully removed in some case. On the other hand, with respect to the barrier layer formed by the CVD or ALD method, the etching quantity of silicon oxide becomes larger than in the case of barrier layer formed by the PVD method for any of the parameters, so that full removal of the barrier layer is ensured. As illustrated hereinabove, where the method of manufacturing a semiconductor device according to the invention is carried out, it can be expected to provide an effect of suppressing development of erosion occurring in the polishing step in a region where wirings have been densely formed.

Next, when the etching method of the invention is adopted, a global step is remarkably reduced. This is particularly described with reference to FIGS. 9A and 9B. In FIGS. 9A and 9B, the ordinate indicates a film thickness and the abscissa indicates line and space values. It will be noted that wirings are so arranged that as the line width of the line and space (L/S) becomes smaller, the wiring density becomes larger.

As shown in FIG. 9A, a region of 0.3 μm in line and 0.3 μm in space (L/S=0.3/0.3) includes an silicon oxide ($SiO_2$) film whose thickness is reduced to 492 nm due to erosion. The thickness of the silicon oxide film is at 500 nm at the other regions including those regions of 1 μm in line and 5 μm in space (L/S=1/5), 2 μm in line and 5 μm in space (L/S=2/5), 5 μm in line and 5 μm in space (L/S=5/5) and 10 μm in line and 5 μm in space (L/S=10/5), and a field region. In this condition, the silicon oxide ($SiO_2$) film was etched and removed by 15 nm by use of such an etching solution of the invention as indicated hereinbefore. As a result, the silicon oxide ($SiO_2$) film was etched as shown in FIG. 9B. On the other hand, the thickness of the copper (Cu) wiring underwent no change. This resulted in an intra-chip step of 12 nm, with an intra-wafer nonuniformity being at 1 nm (6σ) Thus, the total of the steps was found to be 13 nm.

Figure 10A:
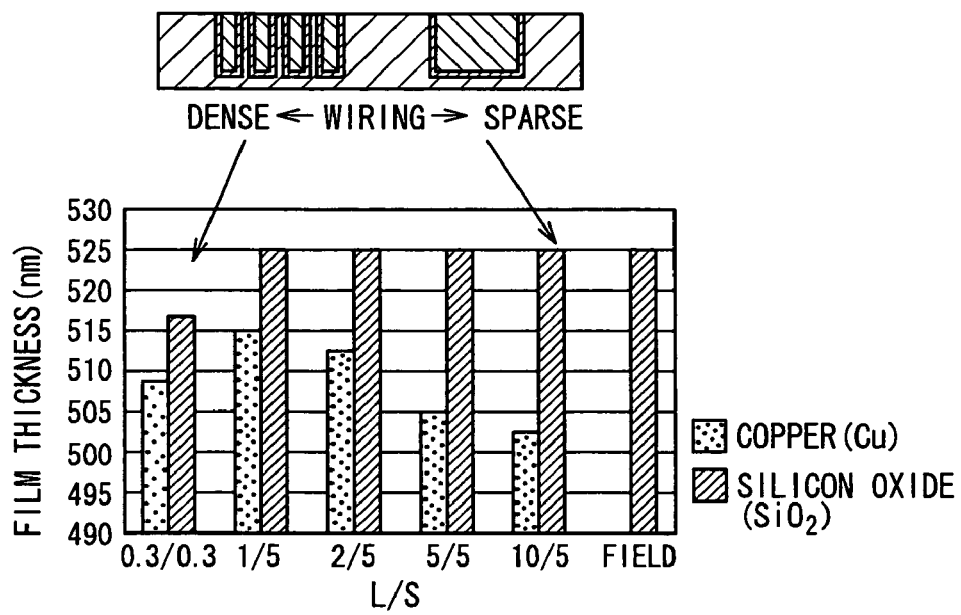
FIGS. 10A and 10B are, respectively, a graphical representation illustrating a reduction of global step attained by the formation of groove wiring using a related-art polishing method alone.
Figure 10B:
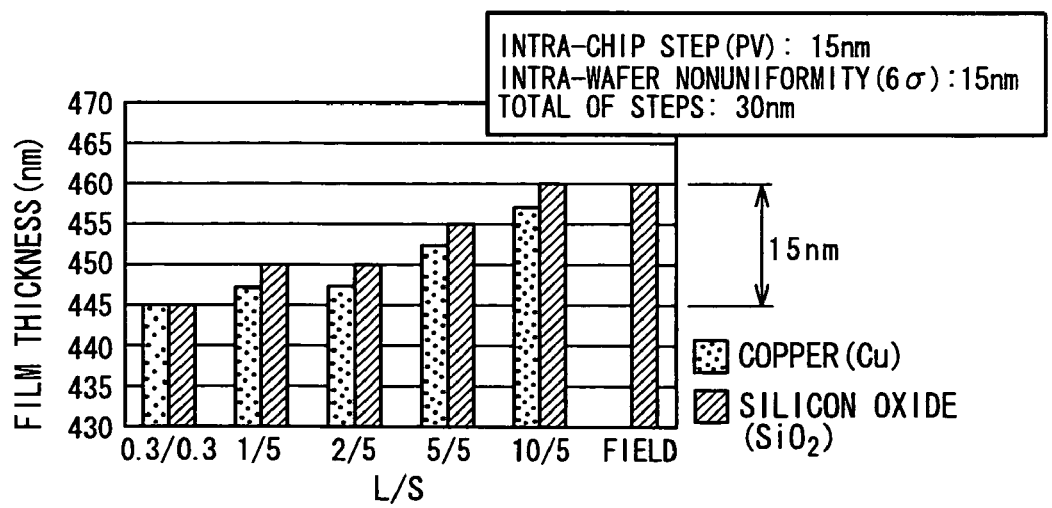
Figure 11A:
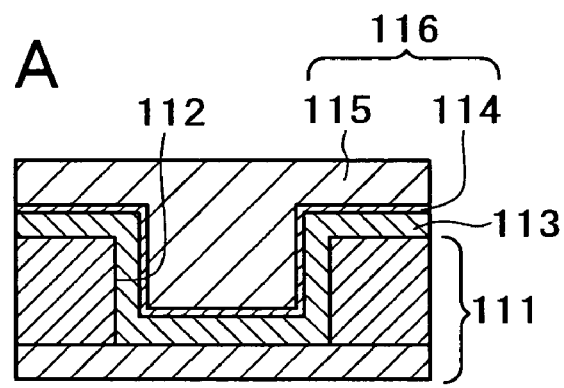
FIGS. 11A and 11B are, respectively, a manufacturing step showing a method of making a copper wiring having a related-art groove wiring structure.
Figure 11B:
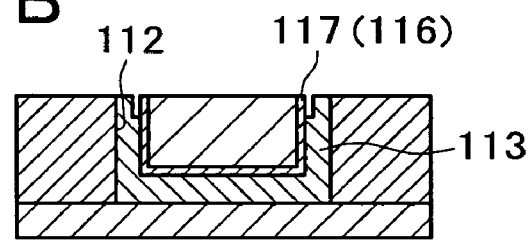
Figure 12A:
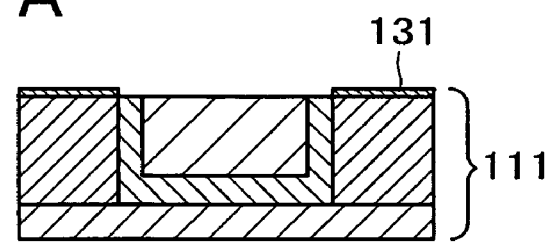
FIGS. 12A and 12B are, respectively, a schematic sectional view of an arrangement illustrating related-art problems.
Figure 12B:
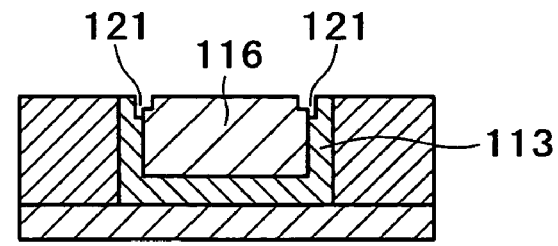

On the other hand, as shown in FIG. 10A, a region of 0.3 μm in line and 0.3 μm in space (L/S=0.3/0.3) includes an silicon oxide ($SiO_2$) film whose thickness is reduced to 517 nm due to erosion. The thickness of the silicon oxide film is at 525 nm at the other regions including those regions of 1 μm in line and 5 μm in space (L/S=1/5), 2 μm in line and 5 μm in space (L/S=2/5), 5 μm in line and 5 μm in space (L/S=5/5) and 10 μm in line and 5 μm in space (L/S=10/5), and a field region. Accordingly, the depth of the recess ascribed to the erosion was the same as with the case of FIG. 9A. In this condition, the silicon oxide film was subjected to related-art polishing for barrier layer to remove the silicon oxide film by polishing in a thickness of 70 nm, calculated as a thickness of silicon oxide film. As a result, the silicon oxide film was removed as shown in FIG. 10B. On the other hand, the copper wirings were also removed by polishing. This resulted in an intra-chip step arriving at 15 nm, with an intra-wafer nonuniformity being at 15 nm (6σ). Thus, the total of the steps was found to be 30 nm.

As will be seen from the foregoing, when the barrier layer is etched according to the etching method of the invention, a reduction in the intra-chip step is approximately at 3 nm and a reduction in the global step is at 17 nm, thus revealing that the total step could be significantly reduced. Hence, the etching method of the invention is very effective in reducing global step. The removal by etching allows a load on an underlying insulating film to be significantly reduced over the case where a barrier layer is removed by polishing. In this sense, where a porous silicon oxide, low dielectric constant film is used, for example, as the underlying insulating film, the etching method of the invention is beneficial. Moreover, because a load on an element beneath the underlying insulating film is mitigated, the element performance is prevented from degradation.

The etching solution, etching method and method for manufacturing a semiconductor device of the invention are all applicable to manufacturing methods of devices forming fine copper wirings such as semiconductor devices, display devices, pickup devices and the like.

What is claimed is:

1. An etching solution comprising a hydrofluoric acid aqueous solution, and an anticorrosive for copper contained in the aqueous solution, wherein said anticorrosive has a molecule size of 10 nm or below.

2. An etching method wherein a surface layer of an insulating film which has copper and a metal or metal compound, which is greater in ionization tendency than copper, exposed thereat and which has the metal or metal compound, which is greater in ionization tendency than copper left on said insulating film is etched, the method comprising the steps of:

applying an anticorrosive for copper on a surface of the copper to form a protective film thereon; and removing, by use of a hydrofluoric acid aqueous solution, said surface layer of said insulating film wherein the metal or metal compound, which is greater in ionization tendency than copper, is left to remove the metal or metal compound left on said insulating film, wherein said anticorrosive has a molecule size of 10 nm or below.

3. An etching method which comprises etching, by use of a hydrofluoric acid aqueous solution containing an anticorrosive for cooper, a surface layer of an insulating film wherein copper and a metal or a metal compound, which is greater in ionization tendency than copper, is exposed at a surface of the insulating film and the metal or metal compound is left on the insulating film to remove the metal or metal compound left on the insulating film, wherein said anticorrosive has a molecule size of 10 nm or below.

4. A method of manufacturing a semiconductor device which comprises the steps of:

forming copper over a barrier layer made of a metal or metal compound, which is greater in ionization tendency than cooper, so as to bury a wiring groove formed in an insulating film, and polishing additional copper and barrier layer formed on the insulating film; and etching a surface layer of said insulating film by use of a hydrofluoric acid aqueous solution containing an anticorrosive for copper to remove said barrier layer left on said insulating film along with the surface layer of said insulating film, wherein said anticorrosive has a molecule size of 10 nm or below.

* * * * *